US008198953B2

(12) United States Patent
Sanada

(10) Patent No.: US 8,198,953 B2
(45) Date of Patent: Jun. 12, 2012

(54) TWO-DIMENSIONAL LEFT-HANDED METAMATERIAL

(75) Inventor: Atsushi Sanada, Yamaguchi (JP)

(73) Assignee: Yamaguchi University, Yamaguchi-shi (JP)

( * ) Notice: Subject to any disclaimer, the term of this patent is extended or adjusted under 35 U.S.C. 154(b) by 586 days.

(21) Appl. No.: 12/442,658

(22) PCT Filed: Sep. 18, 2007

(86) PCT No.: PCT/JP2007/068095

§ 371 (c)(1), (2), (4) Date: Mar. 24, 2009

(87) PCT Pub. No.: WO2008/038542

PCT Pub. Date: Apr. 3, 2008

(65) Prior Publication Data

US 2010/0007436 A1 Jan. 14, 2010

(30) Foreign Application Priority Data

Sep. 26, 2006 (JP) ................................. 2006-260907

(51) Int. Cl.
*H04B 3/40* (2006.01)
*H03H 7/00* (2006.01)
*H01P 7/00* (2006.01)

(52) U.S. Cl. .......................................... 333/23; 333/219

(58) Field of Classification Search .................. 333/168, 333/197, 219, 23

See application file for complete search history.

(56) References Cited

U.S. PATENT DOCUMENTS 5,728,346 A 3/1998 Haq
6,262,495 B1 7/2001 Yablonovitch et al.
6,512,494 B1 1/2003 Diaz et al.
6,556,103 B2 * 4/2003 Shibata et al. ................ 333/187
6,670,932 B1 12/2003 Diaz et al.
7,525,711 B1 * 4/2009 Rule et al. ..................... 359/244
7,683,444 B2 * 3/2010 Tonucci ......................... 257/421
7,741,933 B2 * 6/2010 Duwel et al. .................. 333/187
7,864,114 B2 * 1/2011 Sanada .................. 343/700 MS
2003/0122729 A1 7/2003 Diaz et al.
2006/0152430 A1 7/2006 Seddon et al.
2009/0033586 A1 2/2009 Sanada
2010/0265552 A1 * 10/2010 Wang et al. ....................... 359/9

FOREIGN PATENT DOCUMENTS

EP 1860724 A1 11/2007
JP 2002-510886 A 4/2002
JP 2002-204123 A 7/2002
JP 2006-245926 A 9/2006
JP 2006-245984 A 9/2006
WO 99/50929 A1 10/1999
WO 2004/025783 A1 3/2004

OTHER PUBLICATIONS

International Search Report of PCT/JP2007/068095, date of mailing Nov. 27, 2007.

* cited by examiner

*Primary Examiner* — Dean O Takaoka
*Assistant Examiner* — Alan Wong
(74) *Attorney, Agent, or Firm* — Westerman, Hattori, Daniels & Adrian, LLP

(57) ABSTRACT

A two-dimensional left-handed metamaterial that functions as a two-dimensional electromagnetic wave propagation medium in which the equivalent permittivity and permeability of the medium are both negative, exhibits superior low-loss, broadband characteristics as a left-handed material, and has a simple constitution, enabling low-cost manufacture.

6 Claims, 5 Drawing Sheets

TWO-DIMENSIONAL LEFT-HANDED METAMATERIAL

TECHNICAL FIELD

The present invention relates to an artificial material (metamaterial) for propagating electromagnetic waves, and more particularly to a two-dimensional left-handed metamaterial that functions as a two-dimensional electromagnetic wave propagation medium in which the equivalent permittivity and permeability of the medium are both negative.

BACKGROUND ART

A material having properties that do not exist in nature can be constructed artificially by arranging chips (unit structures) of metal, dielectric material, magnetic material, superconducting material, and so on at sufficiently short intervals relative to the wavelength (no more than approximately one tenth of the wavelength). This type of material belongs to a larger category than a category of materials found in nature, and is therefore known as a metamaterial. The properties of a metamaterial vary according to the shape, materials, and arrangement of the unit structure.

Among such metamaterials, a metamaterial in which an equivalent permittivity $\in$ and a permeability $\mu$ are simultaneously negative is known as a "left-handed material (LHM)" since the electric field, magnetic field, and wave vector thereof form a left-handed system. In this specification, a left-handed material is referred to as a left-handed metamaterial. In contrast, a normal material in which the equivalent permittivity $\in$ and permeability $\mu$ are simultaneously positive is known as a "right-handed material (RHM)". As shown in FIG. 1, a relationship area between the material and the permittivity $\in$ and permeability $\mu$ can be divided into first through fourth quadrants corresponding to the sign of the permittivity $\in$ and the sign of the permeability $\mu$. A right-handed material is a material belonging to the first quadrant, and a left-handed material is a material belonging to the third quadrant.

A left-handed metamaterial possesses particularly idiosyncratic properties such as the existence of a wave (known as a backward wave) in which the signs of the group velocity (the speed at which energy is propagated) and phase velocity (the speed at which a phase advances) of the wave are reversed, and evanescent wave amplification, an evanescent wave being a wave that decays exponentially in a non-propagation area. A line that transmits backward waves generated by a left-handed metamaterial can also be constructed artificially. This is described in the following Non-Patent Document 1 and Non-Patent Document 2, and is therefore well known.

A line on which backward waves are propagated by arranging unit cells constituted by a metallic pattern periodically has been proposed on the basis of this concept of left-handed material construction. This transmission characteristic has been handled theoretically up to the present time, and hence the facts that the line possesses a left-handed transmission band, a band gap occurs between the left-handed transmission band and a right-handed transmission band, the width of the band gap can be controlled in accordance with reactance in the unit cell, and so on have become theoretically evident. These points are described in the following Non-Patent Document 3.

[Non-Patent Document 1]

D. R. Smith, W. J. Padilla, D. C. Vier, S. C. Nemat-Nasser, and S. Schultz, "Composite medium with simultaneously negative permeability and permittivity," Phys. Rev. Lett., vol. 84, no. 18, pp. 4184-4187, May 2000

[Non-Patent Document 2]

C. Caloz, and T. Itoh, "Application of the transmission line theory of left-handed (LH) materials to the realization of a microstrip LH line", IEEE-APS Int'l Symp. Digest, vol. 2, pp. 412-415, June 2002

[Non-Patent Document 3]

Atsushi Sanada, Christophe Caloz and Tatsuo Itoh, "Characteristics of the Composite Right/Left-Handed Transmission Lines," IEEE Microwave and wireless Component Letters, Vol. 14, No. 2, pp. 68-70, February 2004

Left-handed metamaterials can be broadly divided into resonant materials and non-resonant materials, depending on the constitution thereof. The initially created left-handed metamaterials were resonant. A resonant left-handed metamaterial uses an area in which both the permittivity of an artificial dielectric material and the permeability of an artificial magnetic material are negative in the vicinity of the resonance frequency. Therefore, this type of material is disadvantaged in that the frequency bandwidth in which the material functions as a left-handed material is narrow. Moreover, since a frequency in the vicinity of the resonance frequency is used, an increase in loss occurs.

In contrast, a non-resonant left-handed metamaterial is based on a transmission line characteristic according to which the distributed inductance (L) and the distributed capacitance (C) of the transmission line of a normal medium are reversed. In a transmission line having reversed distributed constants LC, the aforementioned backward waves are transmitted, and therefore the line functions as a left-handed metamaterial. The frequency bandwidth in which a non-resonant left-handed metamaterial functions as a left-handed material is wider than that of the resonant left-handed metamaterial, and therefore a reduction in loss is achieved.

A transmission circuit employing a lumped constant LC element (a chip inductor, a chip capacitor, and so on) and a distributed constant type material in which periodical structures are disposed on a transmission line have been used as non-resonant left-handed metamaterials. However, there is an upper limit to the operation frequency of a material employing a lumped constant LC element (operations are only possible at or below the self-resonant frequency of the element), and it is therefore difficult to realize a left-handed metamaterial that operates at or above several GHz. Further, this type of material uses a large number of lumped constant LC elements, and is therefore difficult and expensive to manufacture. As regards distributed constant type materials, research has focused mainly on plane circuit type structures formed on dielectric substrates. However, it has not been possible up to the present time to realize a non-resonant left-handed material in relation to a radiation field rather than electromagnetic waves in the plain circuit.

DISCLOSURE OF THE INVENTION

It is therefore an object of the present invention to provide a two-dimensional left-handed metamaterial that functions as a two-dimensional electromagnetic wave propagation medium in which the equivalent permittivity and permeability of the medium are simultaneously negative, exhibits superior characteristics as a left-handed material and has a simple constitution, enabling low-cost manufacture.

To achieve this object, a two-dimensional left-handed metamaterial according to the present invention is a two-dimensional left-handed metamaterial in which unit structures constituted by a conductor are disposed regularly on a plane, the unit structure including: a columnar first prism, a central axis of which is oriented perpendicularly to the plane; a columnar second prism that has a central axis in an identical direction to the first prism and is disposed at a remove from the first prism in a central axis direction; and a connecting body for electrically connecting the first prism and the second prism to each other, wherein the unit structures are disposed in identical positions in a perpendicular direction to the plane and so as not to contact another unit structure.

Further, in the two-dimensional left-handed metamaterial described above, the first prism and the second prism may be formed such that a cross-section thereof perpendicular to the central axis takes a square shape.

Further, in the two-dimensional left-handed metamaterial described above, the first prism and the second prism may be formed such that a cross-section thereof perpendicular to the central axis takes a regular hexagonal shape.

Further, in the two-dimensional left-handed metamaterial described above, the first prism, the second prism, and the connecting body may be disposed such that respective central axes thereof are collinear.

Further, in the two-dimensional left-handed metamaterial described above, a dimension of the connecting body in a perpendicular direction to the central axis thereof may be smaller than a dimension of the first prism and the second prism in a perpendicular direction to the central axes thereof.

By being constituted in the manner described above, the present invention exhibits the following effects.

A unit structure in which the first prism and second prism are connected to each other is used, and therefore inductance between the first prism and second prism can be increased, enabling a reduction in the operation frequency. In other words, the dimensions of the unit structure can be reduced in comparison with the wavelength of the electromagnetic wave, and therefore the left-handed metamaterial can be brought closer to a homogeneous medium.

By making the cross-section of the first prism and second prism square, a further increase in capacitance between adjacent unit structures can be achieved. As a result, the operation frequency can be reduced even further, whereby the left-handed metamaterial can be brought even closer to a homogeneous medium.

By making the cross-section of the first prism and second prism regular hexagonal, the operation frequency can be reduced such that the left-handed metamaterial can be brought even closer to a homogeneous medium. Moreover, a further reduction in anisotropy can be achieved, and therefore the left-handed metamaterial can be brought closer to an isotropic medium.

DESCRIPTION OF REFERENCE SYMBOLS

1, 1*a* metamaterial
10, 20 unit structure
11, 21 first prism
12, 22 second prism
13, 23 connecting body

BEST MODE FOR CARRYING OUT THE INVENTION

Figure 1:
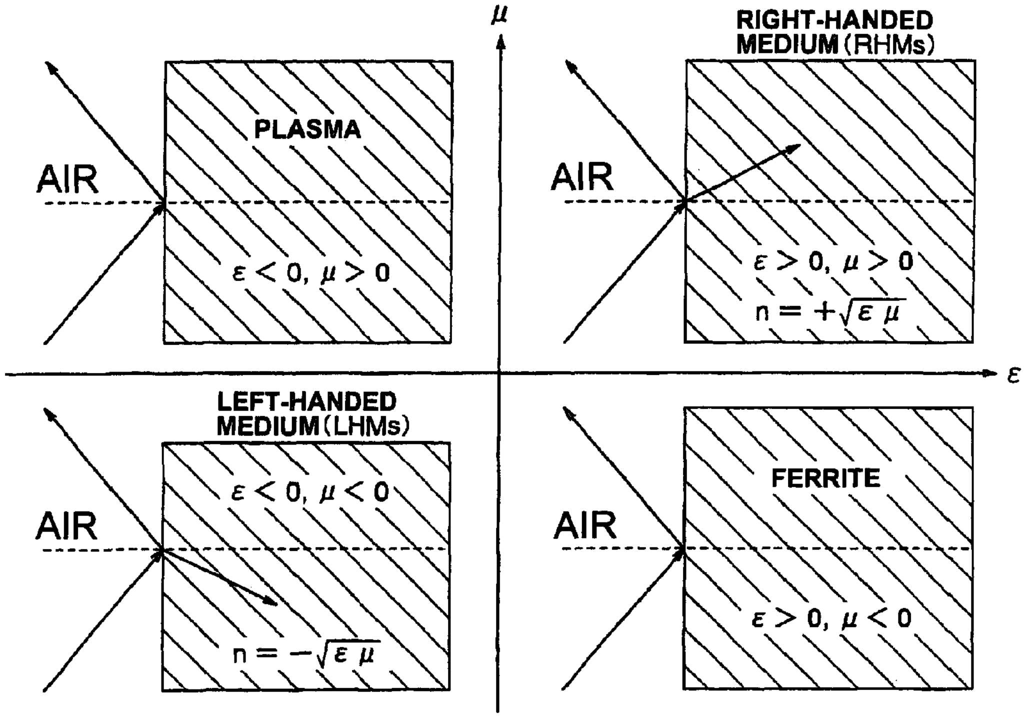
FIG. 1 is a view showing a relationship between materials and sign areas of permittivity $\in$ and permeability $\mu$.
Figure 2:
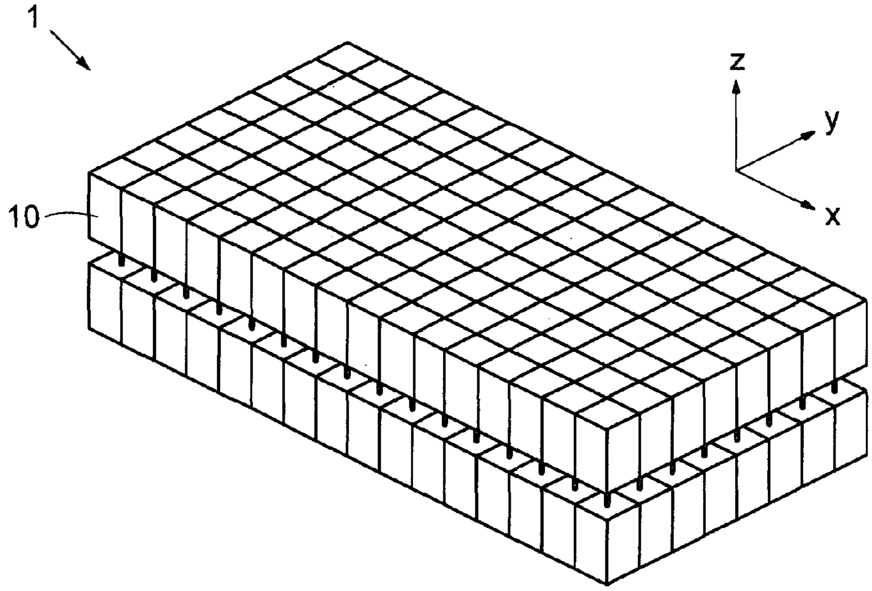
FIG. 2 is a perspective view showing a metamaterial 1 according to a first embodiment of the present invention.

Embodiments of the present invention will now be described with reference to the drawings. FIG. 2 is a perspective view showing a metamaterial 1 according to a first embodiment of the present invention. A unit structure 10 constituted by a conductor (typically metal) is disposed regularly (here, periodically) on a plane (here, an xy plane). In the metamaterial 1, the unit structures 10 are arranged in a lattice form having constant vertical and horizontal intervals (constant pitch).

The respective unit structures 10 are disposed at intervals such that adjacent unit structures 10 do not contact each other. The unit structure 10 may be entirely buried in an insulator or partially fixed into position by a flat plate or the like of the insulator. In FIG. 2, only 16×8=128 unit structures 10 are shown, but in an actual metamaterial, the unit structures 10 are arranged in a larger number.

Figure 3:
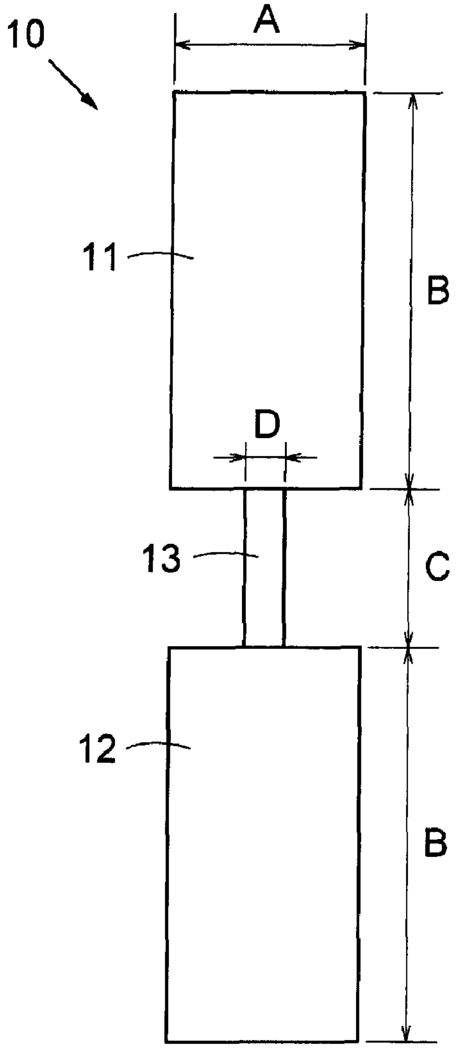
FIG. 3 is a front view showing the constitution of a unit structure 10.
Figure 4:
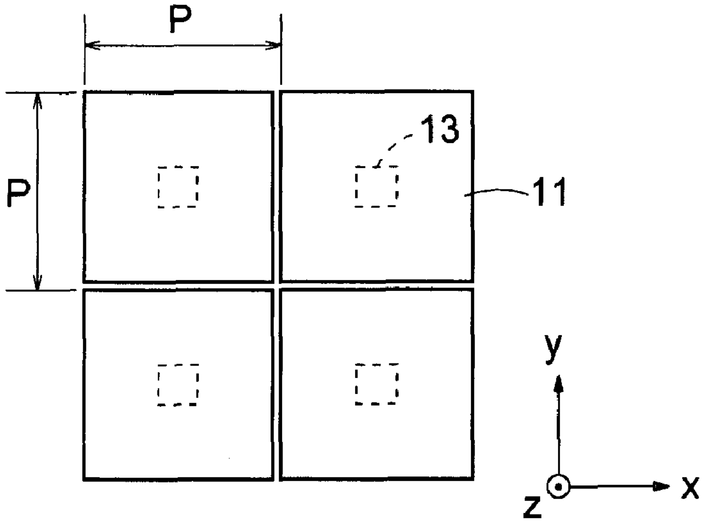
FIG. 4 is a plan view showing the constitution and arrangement of the unit structures 10.

FIG. 3 is a front view showing the constitution of the unit structure 10. FIG. 4 is a plan view showing the unit structure 10 from above. The unit structure 10 is a structure in which a first prism 11 and a second prism 12 are connected by a connecting body 13. The first prism 11, second prism 12, and connecting body 13 are constituted by a conductor (typically metal). The first prism 11 is a quadrangular prism in which a cross-section on a perpendicular plane to a central axis thereof takes a square shape, a vertical direction of FIG. 3 serving as a central axis direction. As shown in the drawing, the length of one side of the square cross-section of the first prism 11 is set as a dimension A, and the length of the first prism 11 in the central axis direction is set as a dimension B.

The second prism 12 is a quadrangular prism having an identical shape to the first prism 11, and is disposed at a remove from the first prism 11 in the central axis direction. The gap between the first prism 11 and second prism 12 in the central axis direction is set as a dimension C. The first prism 11 and second prism 12 are electrically connected by the connecting body 13, which is formed from an identical conductor. The connecting body 13 is a quadrangular prism having a smaller cross-sectional dimension than the first prism 11 and second prism 12 and a square cross-sectional shape. The length of one side of the square cross-section of the connecting body 13 is set as a dimension D. The first prism 11, second prism 12, and connecting body 13 are disposed such that the respective central axes thereof match.

Figure 5:
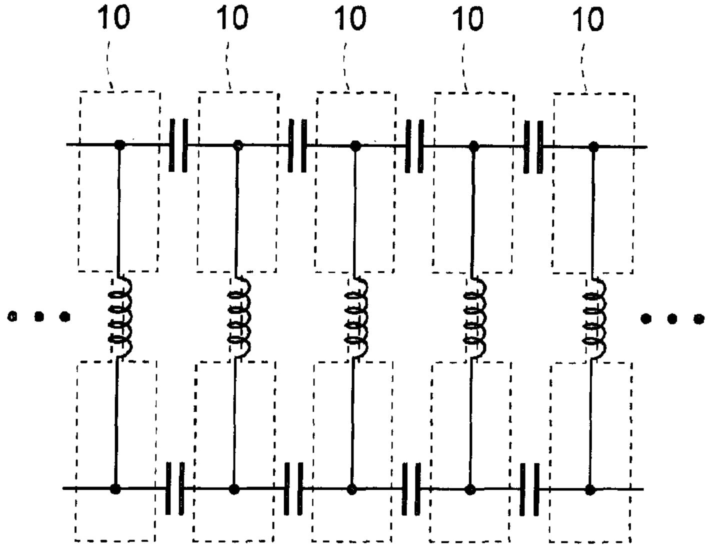
FIG. 5 is a view showing an equivalent circuit of the left-handed metamaterial 1 in which the unit structures 10 are arranged.

FIG. 5 is a view showing an equivalent circuit of the left-handed metamaterial 1 in which the unit structures 10 are arranged. For simplicity, the drawing only shows a one-dimensional arrangement. The material possesses capacitance in series between adjacent first prisms 11 and between adjacent second prisms 12 and possesses inductance between the first prism 11 and second prism 12, and is therefore anonresonant left-handed metamaterial. Hence, in comparison with a resonant material, the material is capable of exhibiting an essentially low-loss, broadband left-handed characteristic.

FIG. 4 shows a planar arrangement of the unit structures 10. The unit structures 10 are disposed at constant intervals (constant pitch) on an xy plane. The x axis direction pitch and the y axis direction pitch are equal, and therefore both pitches are represented by a dimension P. In an actual example of the dimensions of each part of the metamaterial 1, the dimension A is set at 4.8 mm, the dimension B is set at 10.0 mm, the dimension C is set at 4.0 mm, the dimension D is set at 1.0 mm, and the dimension P is set at 5.0 mm. With these dimensions and this arrangement, the metamaterial 1 exhibits a left-handed material characteristic in the vicinity of 2 GHz. Note that these dimensions are merely examples, and other dimensions may be set as desired. When the dimensions and arrangement of the metamaterial are modified, the frequency at which the left-handed material characteristic is exhibited also varies.

Figure 6:
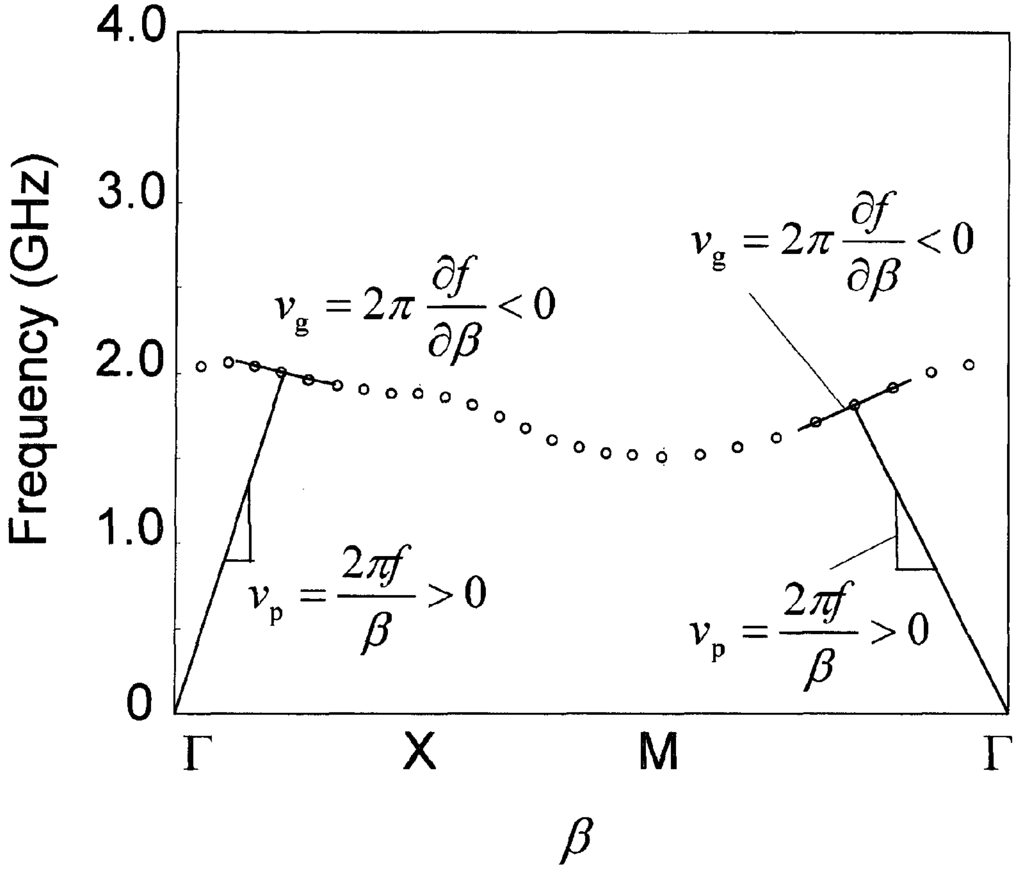
FIG. 6 is a view showing a dispersion characteristic of the metamaterial 1.

FIG. 6 shows a dispersion characteristic of the metamaterial 1 having the dimensions and arrangement described above. FIG. 6 shows the results of an electromagnetic field simulation performed in accordance with a finite element method calculated by applying periodic boundary conditions in the x and y axis directions of the unit structure 10 shown in FIG. 4. When a wave number of the x axis direction is set at $k_x$ and a wave number of the y axis direction is set at $k_y$, a propagation constant $\beta$ is $\beta=(k_x^2+k_y^2)^{1/2}$. On the abscissa of FIG. 6, Γ, X and M respectively denote high symmetry points in the wave number $(k_x, k_y)$ space, or more specifically a point Γ (0, 0), a point X (π/P, 0), and a point M (π/P, π/P). Here, π is the circular constant. In FIG. 6, a Γ-x section denotes a section in which β is varied at a relationship of $0 \leqq k_x \leqq \pi/P$ and $k_y=0$, an X-M section denotes a section in which β is varied at a relationship of $k_x=\pi/P$ and $0 \leqq k_y \leqq \pi/P$, and an M-Γ section denotes a section in which β is varied at a relationship of $\pi/P \geqq (k_x=k_y) \geqq 0$.

Further, the ordinate of FIG. 6 shows the frequency. At an arbitrary point in the Γ-X section and the M-Γ section of this dispersion curve, $2\pi f/\beta$ ($=\omega/\beta$, where ω is the angular frequency), which is obtained by multiplying 2π by the incline of an incline tangent of a straight line drawn from the point Γ, indicates the phase velocity ($v_p$), while $2\pi\partial f/\partial\beta$ ($=\partial\omega/\partial\beta$), which is obtained by multiplying 2π by the incline of a tangent at this point, indicates the group velocity ($v_g$). In the Γ-X section and the M-Γ section of this dispersion curve, the frequency shows a decreasing tendency as the absolute value of β increases, and it can therefore be seen that in these areas, a backward wave, in which the signs of the group velocity and the phase velocity are different, is propagated. The reason for this is that in this area, the metamaterial 1 exhibits a left-handed material characteristic.

The unit structure 10 is formed by connecting the first prism 11 and second prism 12, both of which take the shape of a square column having a square cross-section, using the connecting body 13, and therefore the unit structures 10 have adjacent planes, enabling an increase in the capacitance between adjacent unit structures 10. Hence, the frequency at which the metamaterial 1 operates as a left-handed material can be reduced. In other words, the dimensions of the unit structure 10 can be reduced in comparison with the wavelength of the electromagnetic wave, and the left-handed metamaterial can be brought closer to a homogeneous medium.

Figure 7:
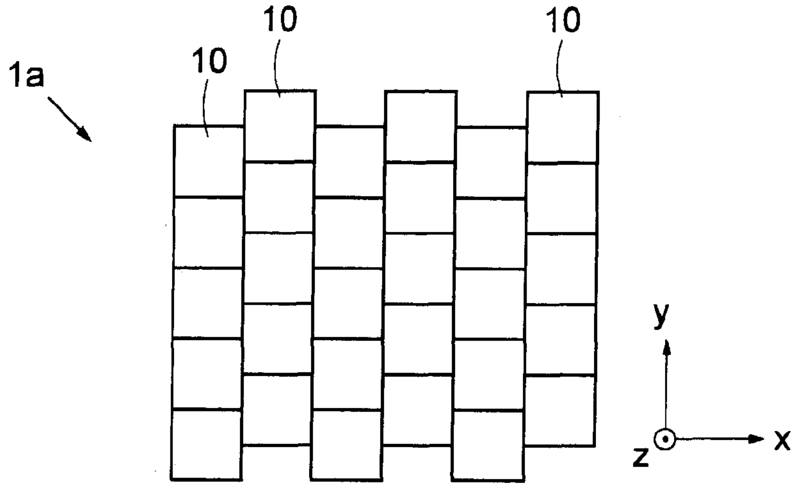
FIG. 7 is a view showing a metamaterial 1*a* according to a second embodiment of the present invention.

FIG. 7 is a plan view showing an arrangement of the unit structures 10 in a metamaterial 1*a* according to a second embodiment of the present invention. The constitution of the unit structure 10 is identical to that shown in FIG. 3. In the metamaterial 1 shown in FIG. 2, the unit structures 10 are arranged in a lattice form having a constant vertical and horizontal pitch, but in the metamaterial 1*a*, the unit structures 10 are arranged at a ½ pitch deviation in the y axis direction in each column. The metamaterial 1*a* also exhibits a left-handed material characteristic with this arrangement.

Various methods of arranging the unit structures 10 may be employed in addition to the arrangements shown in FIGS. 2 and 7, but an arrangement in which anisotropy is reduced to a minimum is desirable in order to bring the metamaterial closer to an isotropic medium. Arranging the unit structures 10 regularly does not only signify a periodic arrangement at completely equal intervals, and may also include an arrangement in which the unit structures deviate from periodic positions, as long as the unit structures do not contact each other. Further, the intervals between the unit structures 10 may be varied in accordance with a predetermined formula.

Note that here, the cross-section of the connecting body 13 of the unit structure 10 takes a similar square shape to those of the first prism 11 and second prism 12, but the cross-section of the connecting body 13 may take essentially any shape, and is not limited to a similar shape. The cross-sectional dimensions of the connecting body 13 are set to be smaller than the dimensions of the first prism 11 and second prism 12, but this also is not an absolute requirement, and a left-handed material can be obtained when the cross-sectional dimensions of the connecting body 13 are approximately identical to the first prism 11 and second prism 12.

Further, in the unit structure 10 shown in FIG. 3, the first prism 11, second prism 12, and connecting body 13 are disposed such that the central axes thereof are positioned collinearly, but this also is not an absolute requirement, and the connecting body 13 may connect the first prism 11 and second prism 12 in any position. The respective central axes of the first prism 11 and second prism 12 may also be set in different positions.

Figure 8:
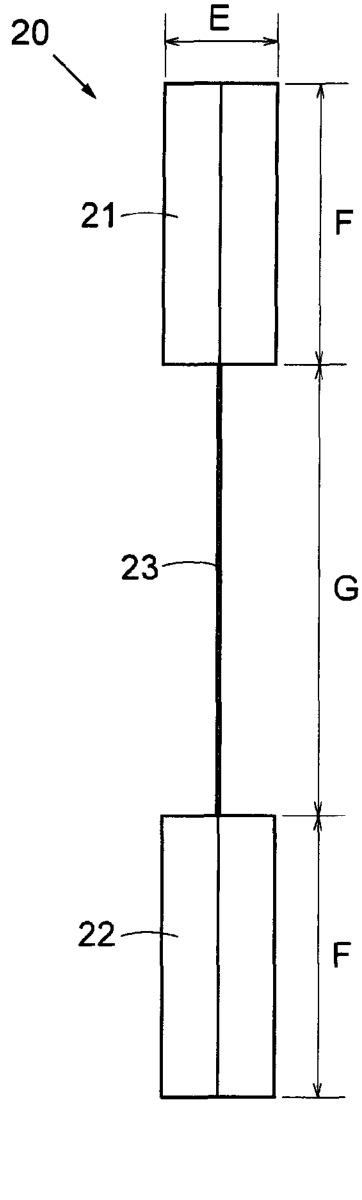
FIG. 8 is a front view showing the constitution of a unit structure 20 of a metamaterial according to a third embodiment.
Figure 9:
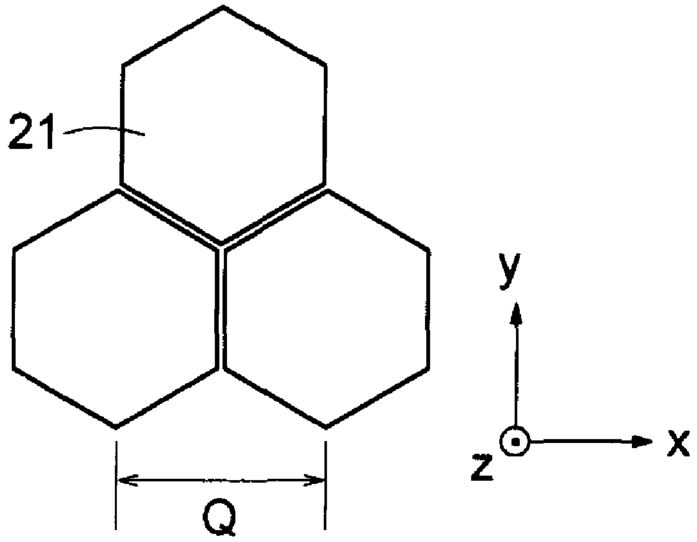
FIG. 9 is a plan view showing the constitution and arrangement of the unit structure 20.

FIG. 8 is a front view showing the constitution of a unit structure 20 of a metamaterial according to a third embodiment. FIG. 9 is a plan view of the unit structure 20, and also shows an arrangement of the unit structures 20. The unit structure 20 is formed by connecting a first prism 21 and a second prism 22 using a connecting body 23. The first prism 21, second prism 22, and connecting body 23 are formed from a conductor (typically metal). The first prism 21 is a hexagonal prism in which a cross-sectional shape on a perpendicular plane to a central axis thereof is regular hexagonal, a vertical direction of FIG. 8 serving as a central axis direction. As shown in the drawing, a distance between two parallel sides of the regular hexagonal cross-section of the first prism 21 is set as a dimension E, and the length of the first prism 21 in the central axis direction is set as a dimension F.

The second prism 22 is a hexagonal prism having an identical shape to the first prism 21, and is disposed at a remove from the first prism 21 in the central axis direction. The gap between the first prism 21 and second prism 22 in the central axis direction is set as a dimension G. The first prism 21 and second prism 22 are electrically connected by the connecting body 23, which is formed from an identical conductor. The connecting body 23 is a hexagonal prism having a smaller cross-sectional dimension than the first prism 21 and second prism 22 and a regular hexagonal cross-sectional shape. The distance between two parallel sides of the regular hexagonal cross-section of the connecting body 23 is set as a dimension H (not shown). The first prism 21, second prism 22, and connecting body 23 are disposed such that the respective central axes thereof match.

In the arrangement of the unit structures 20 shown in FIG. 9, the x axis direction pitch of the unit structures 20 is set as a dimension Q. The dimension Q is greater than the dimension E, and the respective unit structures 20 are disposed at intervals such that adjacent unit structures 20 do not contact each other. In an actual example of the dimensions of each part of this metamaterial, the dimension E is set at 4.157 mm, the dimension F is set at 10.0 mm, the dimension G is set at 16.0 mm, the dimension H is set at 0.173 mm, and the dimension Q is set at 4.33 mm. In this case, the width of the gap between the unit structures 20 is 0.173 mm. With these dimensions and this arrangement, the metamaterial exhibits a left-handed material characteristic. Note that these dimensions are merely examples, and other dimensions may be set as desired.

The unit structure 20 is formed by connecting the first prism 21 and second prism 22, both of which take the shape of a hexagonal column having a regular hexagonal cross-section, using the connecting body 23, and therefore the unit structures 20 have adjacent planes, enabling an increase in the capacitance between adjacent unit structures 20. In addition, in a metamaterial employing the unit structures 20 having a regular hexagonal cross-section, an isotropy can be reduced even further, and therefore the metamaterial can be brought even closer to an isotropic medium.

Note that here, the cross-section of the connecting body 23 of the unit structure 20 takes a similar hexagonal shape to those of the first prism 21 and second prism 22, but the cross-section of the connecting body 23 may take essentially any shape, and is not limited to a similar shape. Further, the cross-sectional dimensions of the connecting body 23 are set to be smaller than the dimensions of the first prism 21 and second prism 22, but this is not an absolute requirement. Furthermore, the respective central axes of the first prism 21, second prism 22, and connecting body 23 do not necessarily have to be collinear, and the connecting body 23 may connect the first prism 21 and second prism 22 in any position. The respective central axes of the first prism 21 and second prism 22 may also be set in different positions.

The first prism and second prism preferably have a regular polygon-shaped cross-section in order to increase capacitance between adjacent unit structures and eliminate prominent anisotropy. An equilateral triangle shape, a square shape, and a regular hexagonal shape may be used as the regular polygon shape, but a regular hexagonal shape is preferable in terms of reducing anisotropy. Note that the cross-sections of the first prism and second prism do not necessarily have to be regular polygon-shaped, and a left-handed material can be formed when the first prism and second prism are constituted by cylinders or prisms having another cross-sectional shape.

A two-dimensional lens that uses the negative refractive index of the medium may be cited as an application of a two-dimensional left-handed metamaterial. With this negative refractive index lens, the resolution of a formed image is equal to the magnitude of the wave source, and therefore the lens operates as a so-called superlens. A superlens is a lens in which the resolution exceeds the diffraction limit (equal to or smaller than the wavelength) of a wave. In a normal lens formed from a right-handed material, the image formation resolution increases beyond the wavelength of the wave source due to the diffraction limit of the wave.

Other possible applications of a two-dimensional left-handed metamaterial include a lens antenna employing the two-dimensional lens described above, a coupler or resonator or two-dimensional beam scan antenna employing a dispersion characteristic, an antenna or reflector using leakage radiation, a delay line or resonator using a surface wave, an artificial magnetic wall, and so on.

INDUSTRIAL APPLICABILITY

A two-dimensional superlens can be realized using the two-dimensional left-handed metamaterial according to the present invention, and a lens antenna employing the two-dimensional superlens can be thus realized. The two-dimensional left-handed metamaterial according to the present invention can also be used in a coupler or resonator or two-dimensional beam scan antenna employing a dispersion characteristic, an antenna or reflector using leakage radiation, a delay line or resonator using a surface wave, an artificial magnetic wall, and so on.

The invention claimed is:

1. A two-dimensional left-handed metamaterial in which unit structures are disposed regularly on a plane, characterized in that each of said unit structures comprises:

a columnar first prism, a central axis of which is oriented perpendicularly to said plane;

a columnar second prism that has a central axis in an identical direction to said first prism and is disposed at a different location from said first prism in a central axis direction; and a connecting body for electrically connecting said first prism and said second prism to each other, wherein said first prism and said second prism are formed such that a cross-section thereof perpendicular to said central axis takes a regular polygonal shape;

wherein said first prism, said second prism and said connecting body are electrical conductors;

wherein said unit structures are disposed in identical positions in a perpendicular direction to said plane and so as not to contact another unit structure.

2. The two-dimensional left-handed metamaterial according to claim 1, characterized in that said first prism and said second prism are formed such that the cross-section thereof perpendicular to said central axis takes a square shape.

3. The two-dimensional left-handed metamaterial according to claim 1, characterized in that said first prism and said second prism are formed such that the cross-section thereof perpendicular to said central axis takes a regular hexagonal shape.

4. The two-dimensional left-handed metamaterial according to any one of claims 1 to 3, characterized in that said first prism, said second prism, and said connecting body are disposed such that respective central axes thereof are collinear.

5. The two-dimensional left-handed metamaterial according to claim 1, characterized in that a dimension of said connecting body in a perpendicular direction to the central axis thereof is smaller than a dimension of said first prism and said second prism in a perpendicular direction to the central axes thereof.

6. A two-dimensional left-handed metamaterial in which unit structures are disposed regularly on a plane, characterized in that each of said unit structures comprises:

a columnar first prism, a central axis of which is oriented perpendicularly to said plane;

a columnar second prism that has a central axis in an identical direction to said first prism and is disposed at a different location from said first prism in a central axis direction; and a connecting body for electrically connecting said first prism and said second prism to each other, wherein said first prism and said second prism are formed such that a cross-section thereof perpendicular to said central axis takes a circular shape;

wherein said first prism, said second prism and said connecting body are electrical conductors;

wherein said unit structures are disposed in identical positions in a perpendicular direction to said plane and so as not to contact another unit structure.

* * * * *